United States Patent
Bargman et al.

[11] Patent Number: 6,134,783
[45] Date of Patent: Oct. 24, 2000

[54] HEAT SINK AND PROCESS OF MANUFACTURE

[76] Inventors: Ronald D. Bargman, 31821 Carlelder, Beverly Hills, Mich. 48025; Ioslav Umanskly, 29356 Breezewood, Farmington Hills, Mich. 48331

[21] Appl. No.: 09/182,730

[22] Filed: Oct. 29, 1998

Related U.S. Application Data

[60] Provisional application No. 60/063,718, Oct. 29, 1997.

[51] Int. Cl.$^7$ .......................................................... F28F 7/00
[52] U.S. Cl. ...................... 29/890.03; 165/80.3; 165/185; 361/704; 176/16.3
[58] Field of Search .................................. 165/80.3, 185; 29/890.03, 890.045, 890.053, 505, 509, 557, 558

[56] References Cited

U.S. PATENT DOCUMENTS

| | | | |
|---|---|---|---|
| 3,763,681 | 10/1973 | Flintoft | 29/890.03 |
| 4,733,453 | 3/1988 | Jacoby | 29/890.03 |
| 5,052,481 | 10/1991 | Horvath et al. | 165/185 |
| 5,351,748 | 10/1994 | Dagan | 165/80.3 |
| 5,369,301 | 11/1994 | Hayashi et al. | |
| 5,421,406 | 6/1995 | Furusawa et al. | 165/185 |
| 5,447,189 | 9/1995 | McIntyre | 165/185 |
| 5,519,938 | 5/1996 | Kojima et al. | 29/890.03 |
| 5,533,257 | 7/1996 | Romero et al. | 29/890.03 |
| 5,542,176 | 8/1996 | Serizawa et al. | 29/890.03 |
| 5,771,966 | 6/1998 | Jacoby | 165/185 |
| 5,781,411 | 7/1998 | Feenstra | 361/704 |

FOREIGN PATENT DOCUMENTS

| | | | |
|---|---|---|---|
| 528606 | 8/1992 | European Pat. Off. | 165/185 |

*Primary Examiner*—Ira S. Lazarus
*Assistant Examiner*—Terrell McKinnon
*Attorney, Agent, or Firm*—John R. Benefiel

[57] ABSTRACT

A heat sink and method of manufacture is described. In the preferred embodiment, an array of tubes are extruded from a block of conductive metal, such as aluminum. A series of plugs or pins are extruded in a first stage, and the plugs are reverse extruded by tooling pins to form tubes of considerable or varying length, integral with the base plate. The tube closed ends are punched so as to form holes through the base plate which has a groove crossing pattern aligned with the holes to provide an air convection flow path. The tubes may be assembled to a base plate as separate elements, and a channel member can also be utilized to provide flow passages extending to each tube.

10 Claims, 16 Drawing Sheets

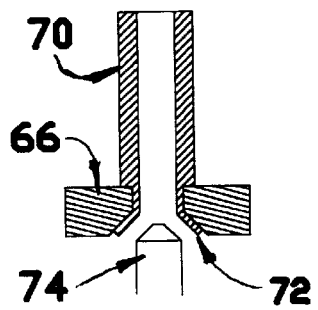
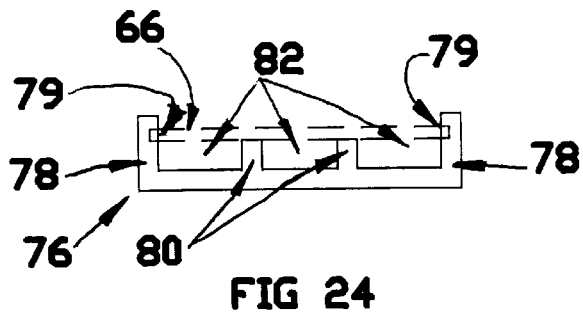
FIGURE 21
FIG 24
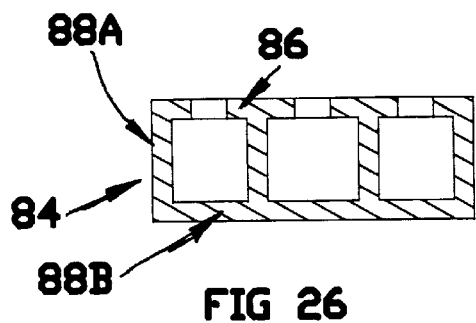
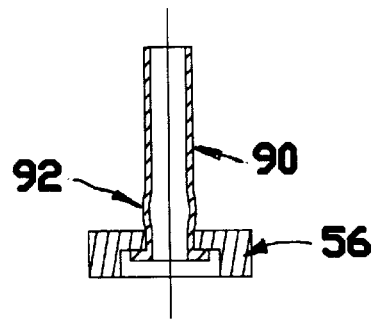
FIG 26
FIGURE 27
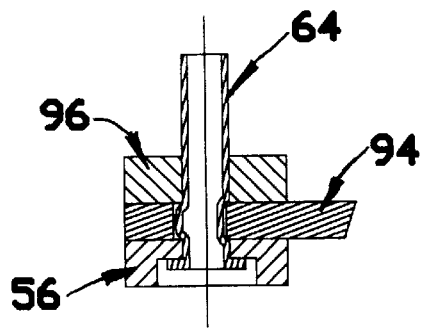
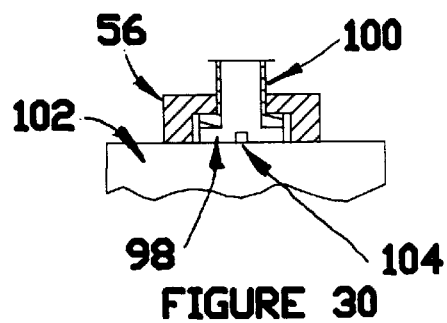
FIGURE 28
FIGURE 30

HEAT SINK AND PROCESS OF MANUFACTURE

This application claims the benefit of U.S. Provisional No. 60/063,718 filed Oct. 29, 1997.

BACKGROUND OF THE INVENTION

This invention concerns heat sinks of a type widely used for dissipating heat from electronic components by conduction, convection, and radiation.

One configuration of a heat sink is shown in U.S. Pat. No. 5,781,411 comprised of a base plate having an array of tubes projecting from a base plate, with one or more holes drilled in the sidewall adjacent the bottom of each tube, creating a chimney effect by the upward draft of air flow through the tubes.

That heat sink is made by machining material from a molded aluminum piece to form the tubes. This process is relatively costly, which is an important factor for an item produced in vast numbers in the very competitive field of personal computers.

U.S. Pat. No. 5,369,301 discloses a solid pin array integral with a base plate. The pins are formed by forging, but this process can produce only limited height pins, which in turn limits the ability of the structure to function to dissipate heat.

Another drawback of the forging process is that it is difficult to provide varying height pins in an array. It has heretofore been recognized that higher fins or pins at the center of an array may be desirable, as the center area typically tends to be hotter.

It is an object of the present invention to provide an improved method of manufacturing a tube array heat sink and an improved heat sink which allows rapid and economical manufacture, while allowing higher and variable height tubular elements, as well as enabling chimney effect air flow through the tubes.

SUMMARY OF THE INVENTION

The above object and others which will become apparent upon a reading of the following specification and claims, are achieved by a multiple extrusion process, beginning with an initial step of exerting pressure on a confined block of a highly heat conductive metal such as aluminum with a tooling piece having an array of holes extending normally to the block surface. This pressure forces the material from the block up into the holes, resulting in the extrusion of an array of plugs extending from a base plate formed by the remaining unextruded portions of the block.

In the next step, a tooling piece comprised of an array of pins is forced into the plugs projecting from the base plate. As the pins are forced into a respective one of the plugs which are disposed in a confinement bore, the material of the plugs is reversely extruded past the pins in being confined by the bore walls, forming a series of hollow or tubular cylinders, closed at one end.

Subsequently, a punching process may be also be carried out, forming through holes into the closed end of each tube, creating an open ended array of tubes integral with the base plate, which openings extend completely through the base plate to the opposite side thereof.

In order to allow a cooling air flow through the tubes, by the chimney effect a groove pattern may be formed into the opposite side of the plate, preferably during the extrusion of the plugs. The grooves intersect with the holes through the base and tubes, and allow air heated by the structure against which the plate is abutted to flow into and up the tubes by a convection effect.

Thus, a heat sink comprised of an array of pins or tubes extending from a base plate to a greater height then heretofore possible may be quickly and economically manufactured. Varying height tubes may also be produced.

In addition, a chimney effect may optionally be provided in the tubes without requiring machining of holes in the sidewalk of the tubes by the effect of the groove pattern in the base plate under surface.

The tubes may also be assembled to the base and attached by a mechanical connection. Grooves in the base plate allow air flow into the tubes, and a separate channel member can provide air flow passages for the same purpose.

DESCRIPTION OF THE DRAWINGS

FIG. 21 is a fragmentary sectional view of an assembled tube and plate.

FIG. 24 is a transverse sectional view of the channel member used in the heat sink shown in FIG. 23.

FIG. 26 is a transverse sectional view of an alternate form of the base plate and channel member.

FIG. 27 is a sectional view of an installed snap-in rivet configuration.

FIG. 28 is a sectional view of an offset plate rivet connection.

FIG. 30 is a sectional view of a slotted head rivet installation.

DETAILED DESCRIPTION

In the following detailed description, certain specific terminology will be employed for the sake of clarity and a particular embodiment described in accordance with the requirements of 35 USC 112, but it is to be understood that the same is not intended to be limiting and should not be so construed inasmuch as the invention is capable of taking many forms and variations within the scope of the appended claims.

The present invention utilizes the principle of reverse extrusion to manufacture a tubular array heat sink in order to economically provide such device. The following drawings are not intended to be detailed representations of the tooling or process steps, as these details are well known to those skilled in the art.

According to the present invention, an extrudable metal having desirable conductivity characteristics, such as aluminum, is reverse extruded to provide a tubular array heat sink. Aluminum plated with copper is another possibility.

Figure 1:
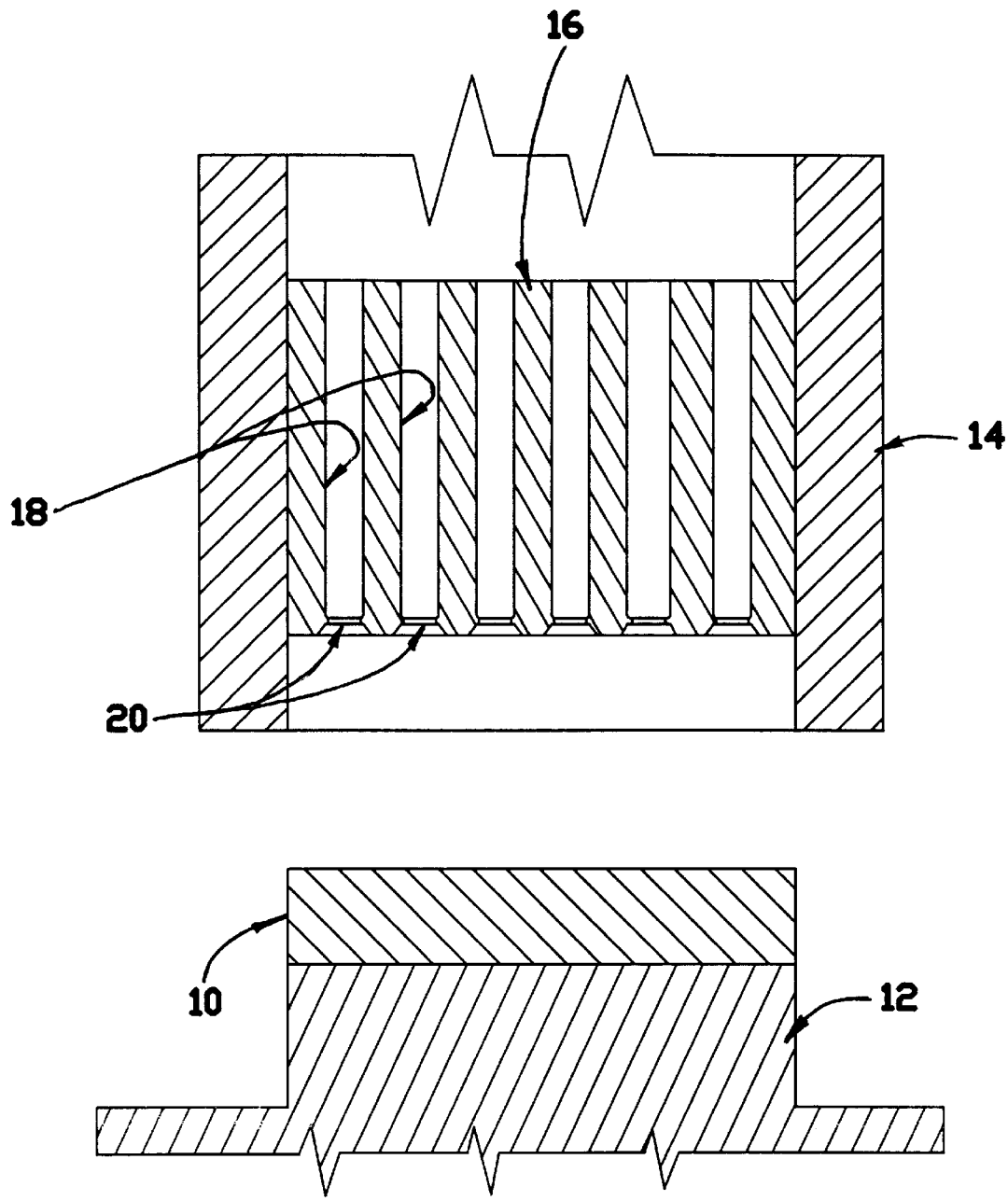
FIG. 1 is sectional view of a simplified representation of tooling and a metal block in position to be reverse extruded in manufacturing a heat sink.

As seen in FIG. 1, a block 10 of the metal is placed on a pedestal 12 positioned below a confining member 14 mounting a die 16 formed with an array of holes 18 having suitable entryways 20 adjacent its lower face.

Figure 2:
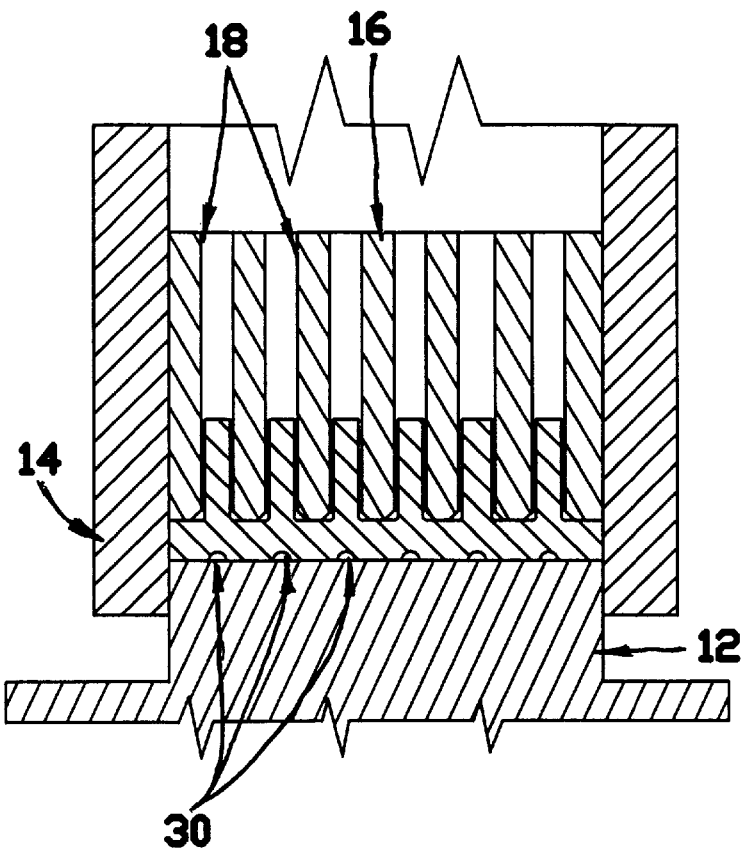
FIG. 2 is a sectional view of the tooling shown in FIG. 1 with the block extruded into an intermediate form.
Figure 3:
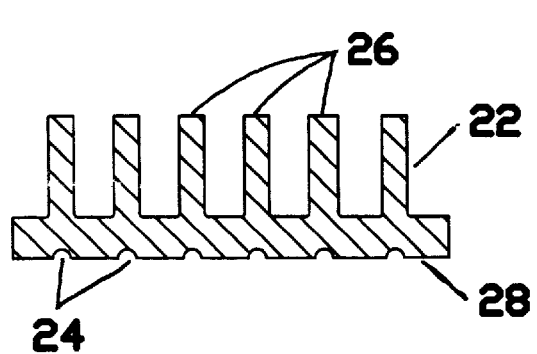
FIG. 3 is a sectional view of the part shown being extruded in FIG. 3.

As seen in FIG. 2, the material of the block 10 is extruded upwardly into the holes 18 as the die 16 and confining member 14 descend under very high ram pressure to compress the block 10. An intermediate part 22 is thereby formed (FIG. 3), having array of cylindrical plugs 26 projecting from a base plate 28. These may extend to a considerable height, particularly if the process is repeated over several stage.

According to one aspect of the present invention, a crossing network of grooves 24 is formed in the bottom side of the base plate 28 opposite the side from which the pins 26 project, as will be explained below.

Figure 4:
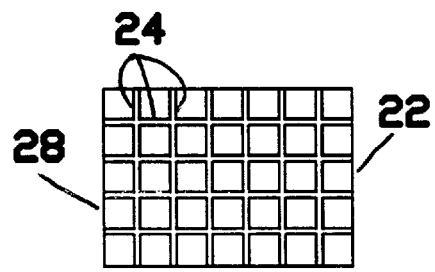
FIG. 4 is bottom plan view of a part shown in FIG. 3.

In this case projecting beads 30 are formed in the upper surface of the pedestal 12. These grooves 24 extend across each other as shown in FIG. 4.

Figure 5:
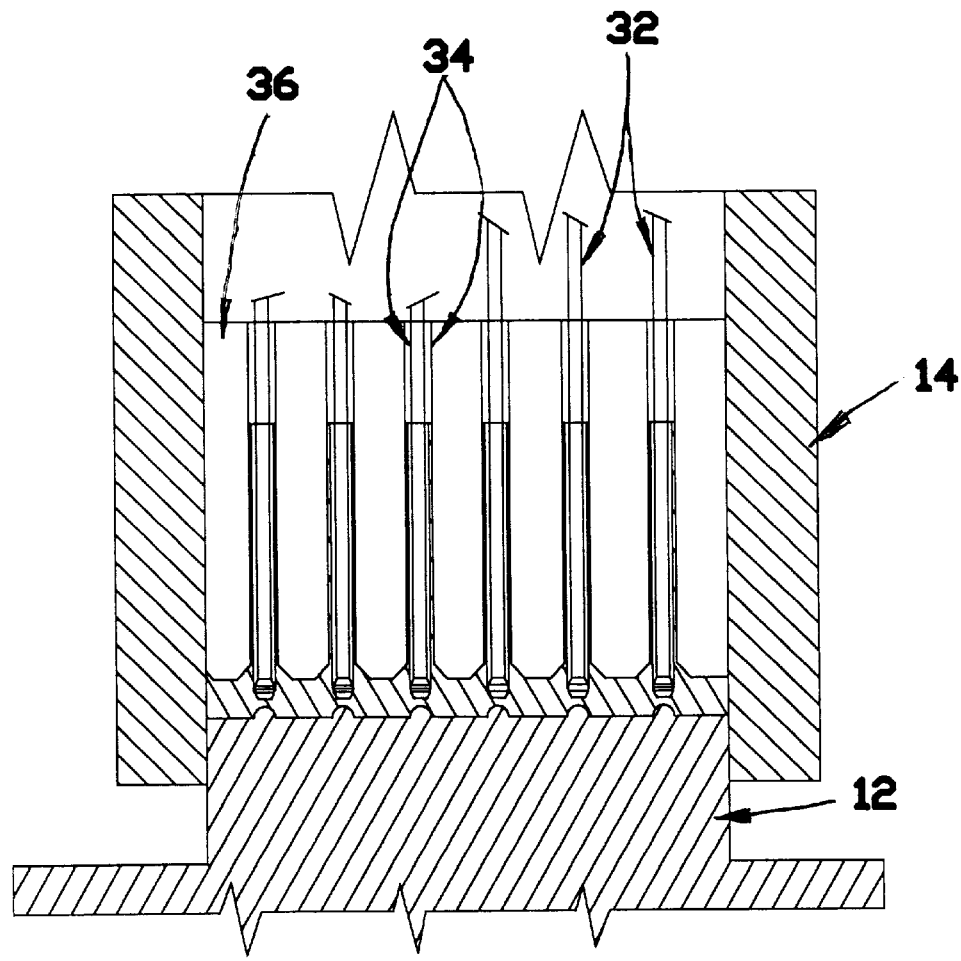
FIG. 5 is a sectional view of additional tooling in which a reverse extrusion step is executed causing the pins or plugs initially formed to be reverse extruded to form extended length tubes closed at one end.
Figure 6:
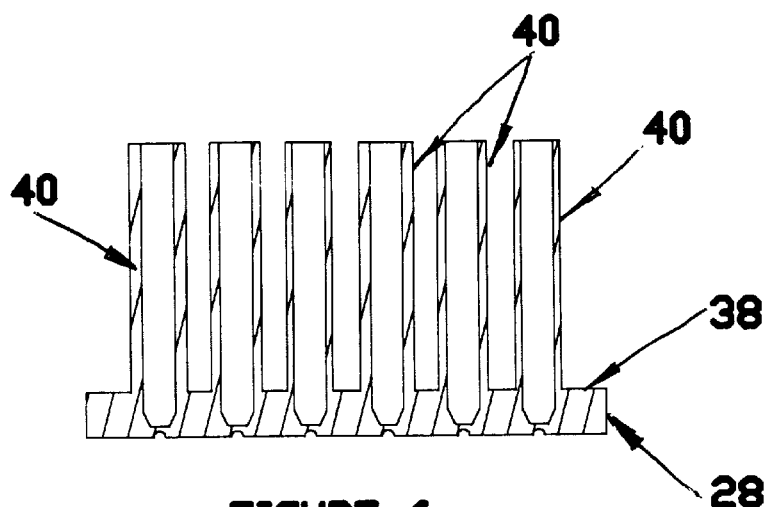
FIG. 6 is a sectional view of the part formed in the extruding step shown in FIG. 5.

FIG. 5 depicts the reverse extrusion stage, using a tooling pin array 32 fit with a clearance space into confinement bores 34 formed in a die 36. The pins plugs 26 are slidable into the bores 34. When the pins 32 descend into the bores 34, they encounter the plugs 26, and upon further movement, the plug material is forced upwardly reversely extruded into contact with the walls of the bores 34. The length achievable is considerable in comparison to the prior art pin forging technique, any may varied by changing the length of the tooling pins 32.

The result is an intermediate part 38, which consists of an array of closed end tubes 40 projecting from base plate 28.

It is noted that there may be additional incremental intermediate forming steps to complete the extrusion processes shown, in which the forming is carried out more gradually then shown, typically with progressive transfers of the part through various stations whereas partial extrusions are carried out.

Also, heating of the block may be necessary in some instances to improve material flow and formability.

These particulars are well known to those skilled in the extruding art, and hence will not be here discussed in detail.

Figure 7:
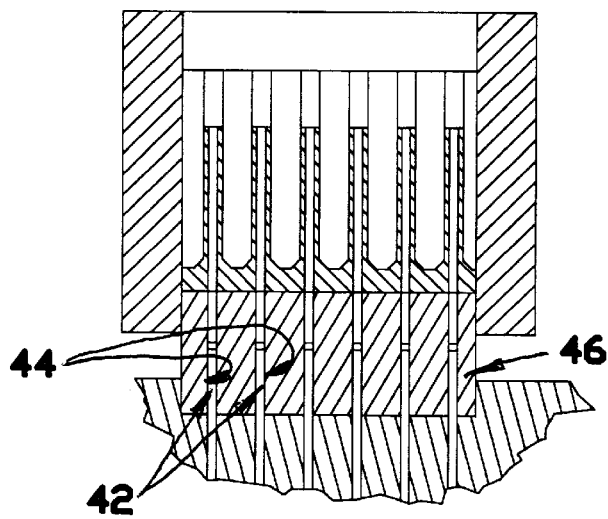
FIG. 7 is a sectional view of additional tooling for punching out the closed end of the tubes and forming corresponding holes through the base plate from which the tubes project.
Figure 8:
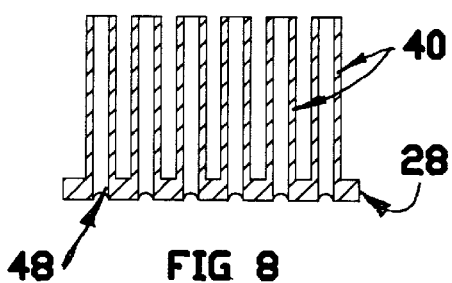
FIG. 8 is a sectional view of a version of the heat sink according to the present invention produced in the tooling shown in FIG. 7.
Figure 9:
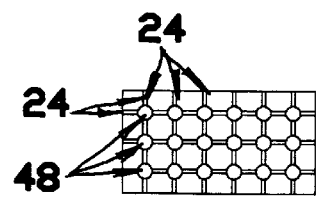
FIG. 9 is a bottom plan view of the heat sink shown in FIG. 8.

In order to provide a chimney effect for the tubes 40, an additional step may optionally be carried out, as seen in FIG. 7. An array of upwardly projecting punches 42 are slidable in guide bores 44 in a guide block 46. The punches 42 are forced upwardly to form holes through the base plate 28 and end wall of the tubes 40, creating through holes 48.

Holes 48 are aligned at the intersection of the grooves 24. This allows heated air to flow into the tubes 40 and rise upwardly by convection, to improve heat transfer from a structure to which the base plate 28 is affixed.

Figure 11:
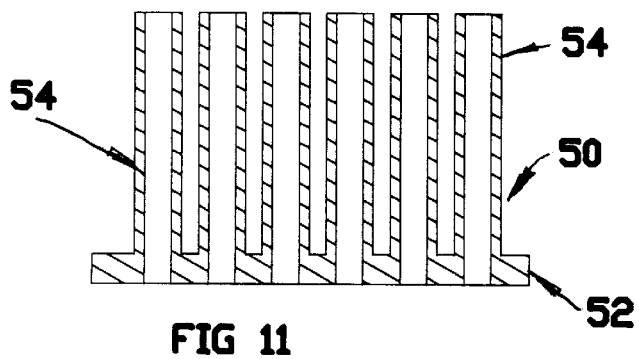
FIG. 11 is a sectional view of a simplified version of the heat sink.
Figure 13:
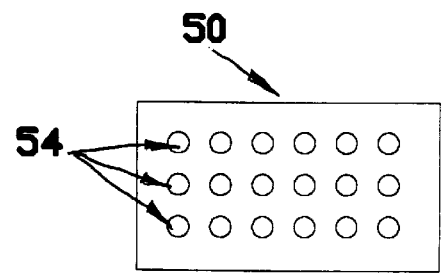
FIG. 13 is a plan view of the bottom of the heat sink shown in FIGS. 11 and 12.
Figure 10:
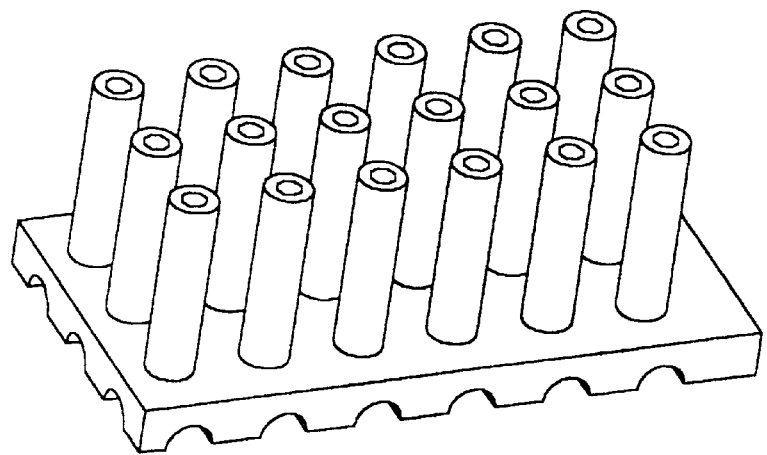
FIG. 10 is a perspective view of the heat sink shown in FIG. 8.
Figure 12:
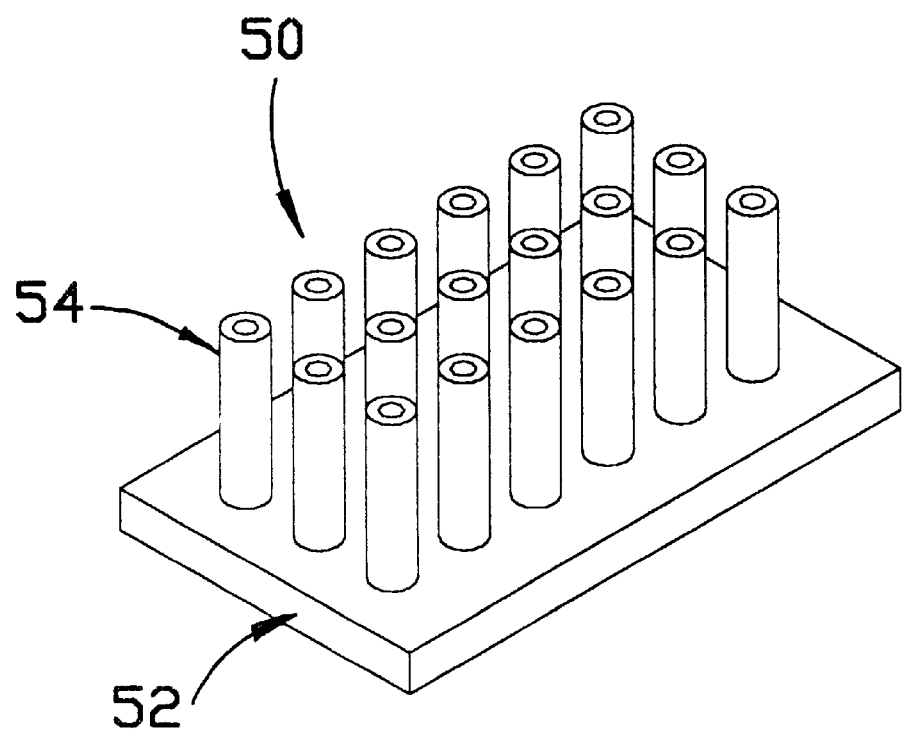
FIG. 12 is a perspective view of the part shown in FIG. 11.
Figure 14:
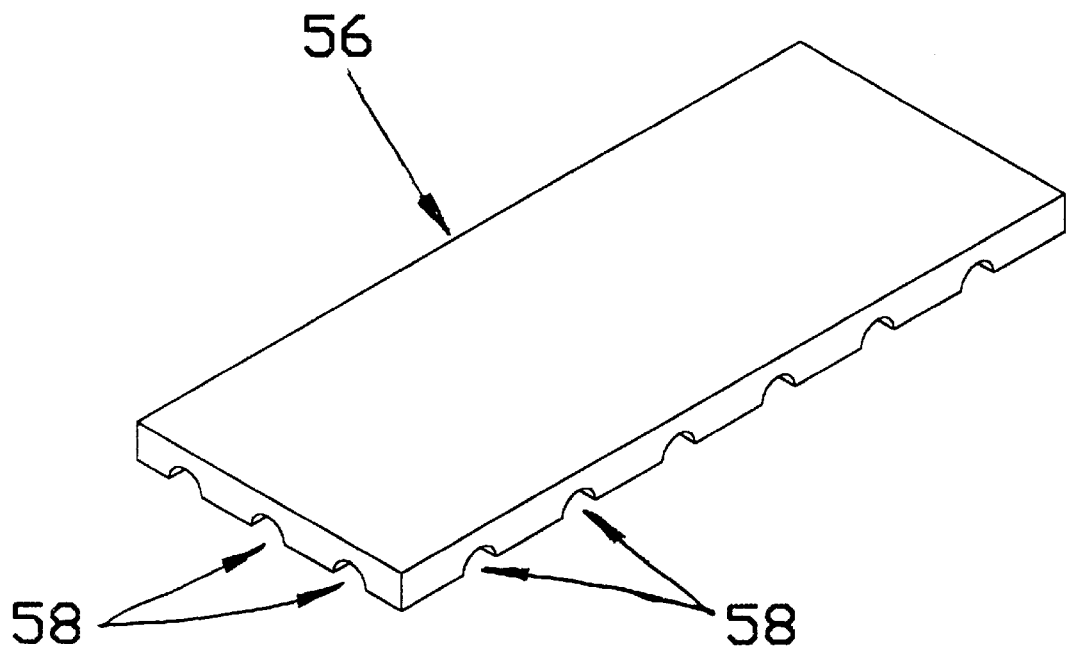
FIG. 14 is a perspective view of a partially formed base plate for use in an assembled version of the heat sink according to the invention.

FIGS. 11–13 show an alternate simplified form of heat sink 50, in which grooves are not formed in the base plate 52, such that convection occurs only on the outside surfaces of the tubes 54.

The improved heat sink having air flow passages beneath the base plate can also be produced by an assembly process, although the reverse extrusion process is preferred due to the much lower costs involved.

Referring to FIGS. 14–26, such an assembly processes are illustrated. A base plate 56 of aluminum or other suitable material is initially formed with a pattern of crossing groove 58, on one side.

Figure 15:
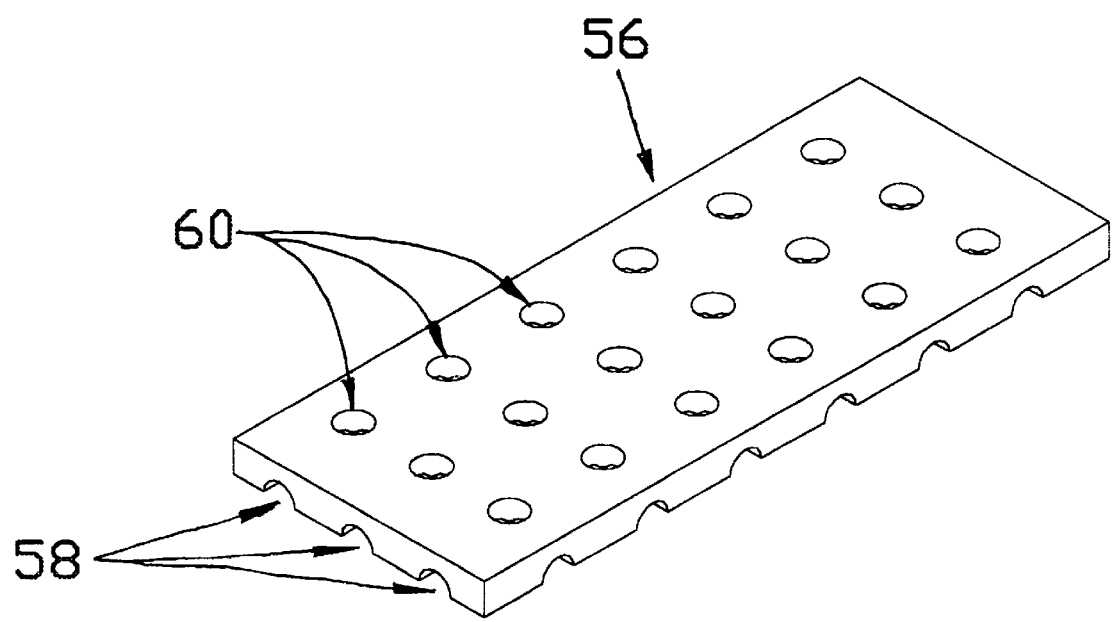
FIG. 15 is a perspective view of the base plate shown in FIG. 14 with a series of holes formed in the base plate.
Figure 16:
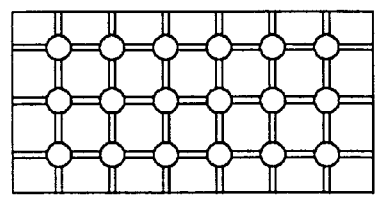
FIG. 16 is a plan bottom view of the base plate shown in FIG. 15.
Figure 17:
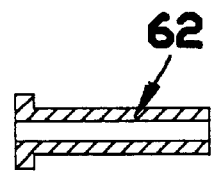
FIG. 17 is a sectional view of a tubular rivet used to form the tubes in the heat sink according to the invention.
Figure 18:
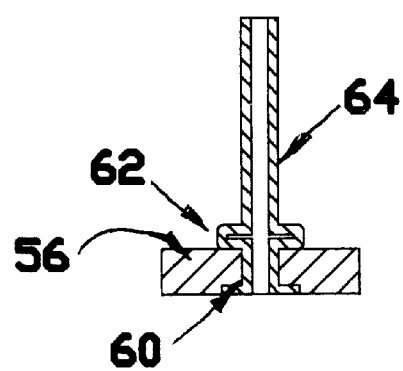
FIG. 18 is a sectional view of a fragmentary portion of a base plate with a tubular rivet crimped in position.

A series of counterbore holes 60 is then machined or punched into the base plate 56 aligned the intersection of the grooves 58 (FIGS. 15 and 16).

Figure 19:
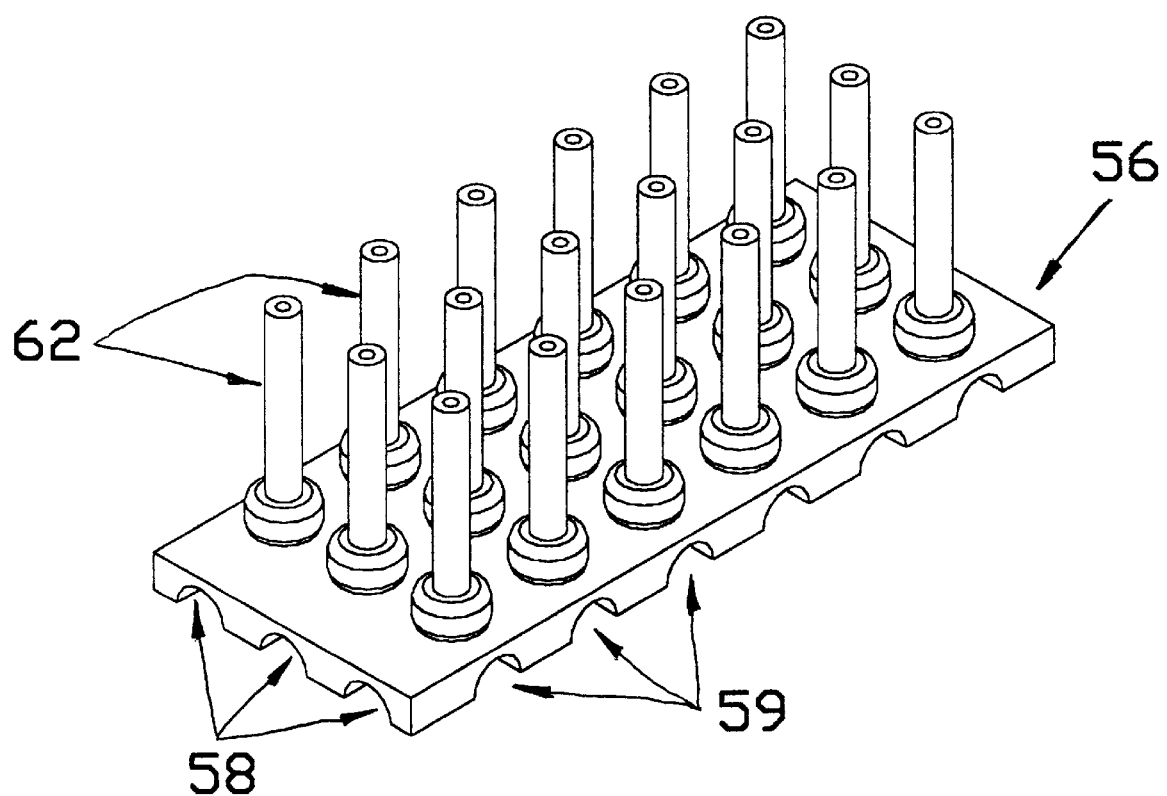
FIG. 19 is a perspective view of a completed assembled version of the heat sink according to the present invention.

A tubular rivet 62 (FIG. 17) is inserted into each counterbored hole 60 and crimped at the surface to the mechanically lock the rivets 62 in a position projecting from the upper side of the base plate 56. This provides an array of tubes 64 as seen in FIG. 19 which communicate with the grooves 58 to establish a chimney effect without requiring machining of the tubes 64.

FIGS. 20–25 show another embodiment in which a relatively thin base plate 66 is formed with tapering holes 68. A series of tubes 70 each have their bottom end 72 formed with a reduced outside diameter to create a shoulder. The tubes 70 are each assembled into a respective one of the holes 68, and then the ends 72 are flared with a tool 74 to be mechanically locked to the plate 66.

Figure 22:
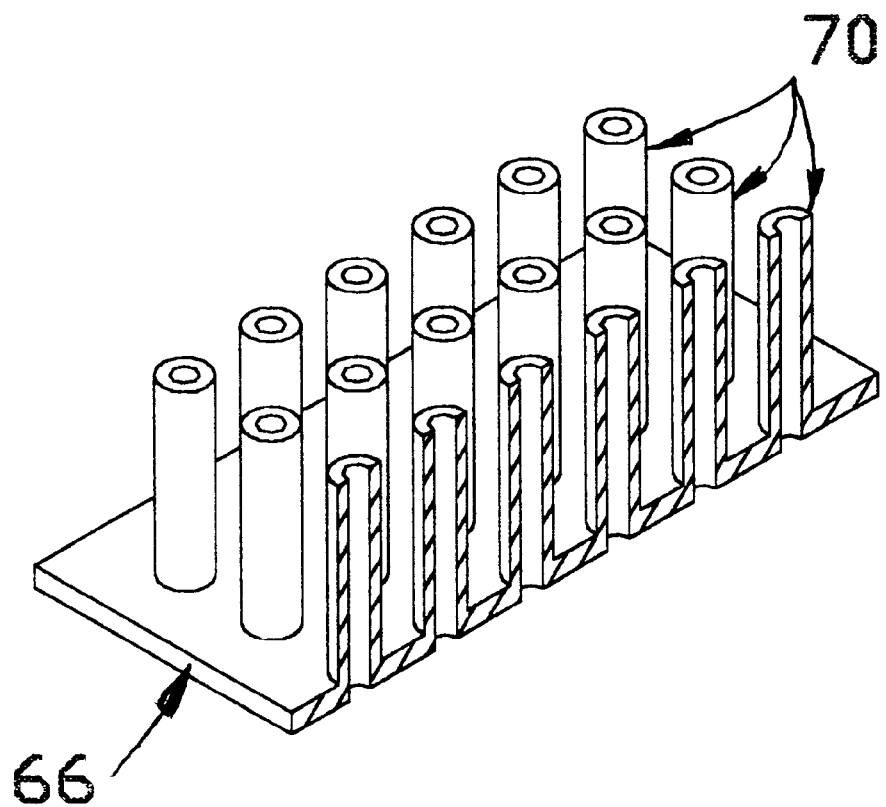
FIG. 22 is a fragmentary perspective view of the second embodiment of the assembled version of the heat sink.
Figure 23:
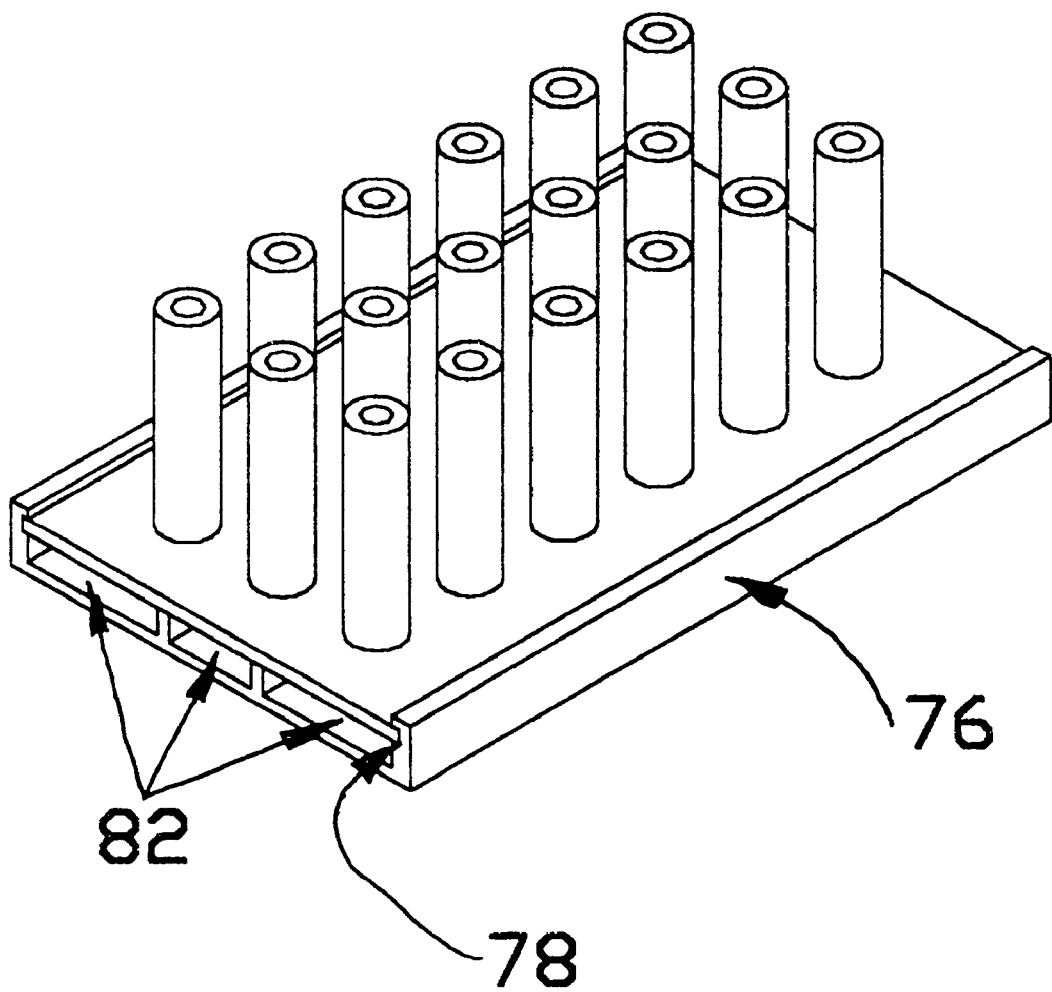
FIG. 23 is a perspective view of an assembled tube array heat sink in which air flow passages are added by installation of the base plate onto a channel member.

This creates an array of the tubes 70 projecting from one side of the plate 66 (FIG. 22).

Next, a channel member 76 (FIG. 23) having side walls 78 slotted at 79 to accommodate the plate 66 is fabricated, with intermediate ribs 80 defining flow passages 82 on the underside of the plate 66 when the plate 66 is installed in the slotted sides 78.

The flow passages 82 communicate with the tube interior to set up a chimney effect.

Figure 25:
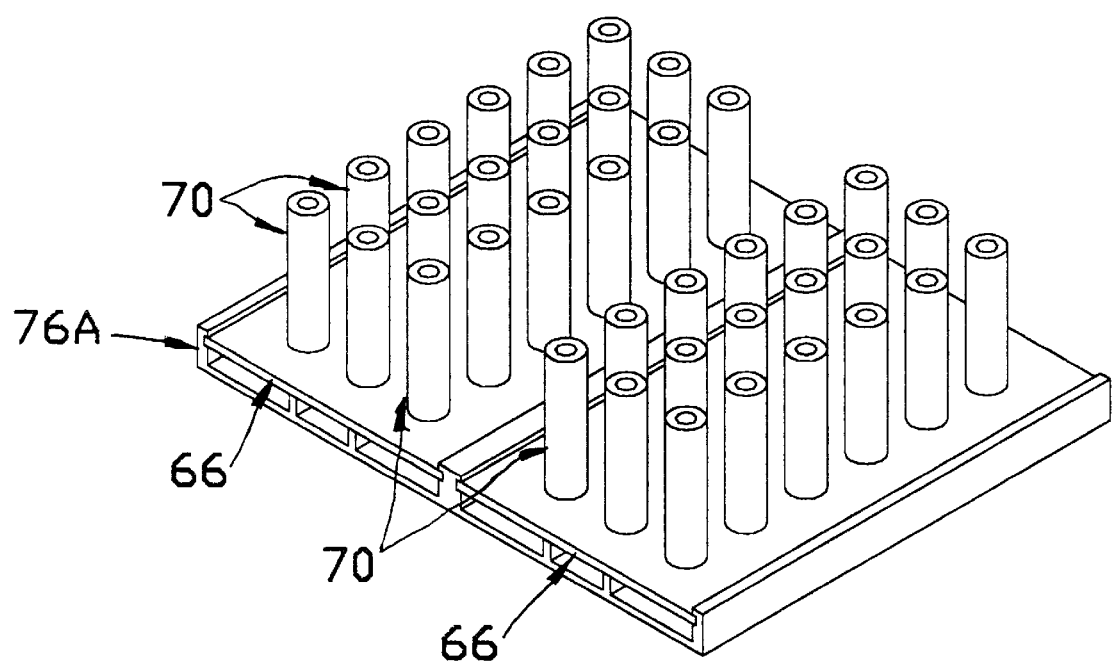
FIG. 25 is a perspective view of the heat sink embodiment shown in FIG. 23 with tube arrays ganged together.

As seen in FIG. 25, the channel member 76A may be made to accommodate two or more ganged base plates 66 with the tube arrays, to increase the heat transfer capabilities.

FIG. 26 shows an alternate form of the channel member 84, which is of two piece construction, incorporating the base plate 86 as an integral position. The two pieces 88A, 88B can be interlocked as shown.

FIG. 27 shows a snap-in rivet 90 performed with a crimp 92, such that they can be assembled by pushing the same into the base plate 56 to establish a snap fit. FIG. 28 shows a center plate 94 and outer plate 96 added to the base plate 56. By shifting the center plate 94, deformation of the rivet 64 locks the same in position.

Figure 29:
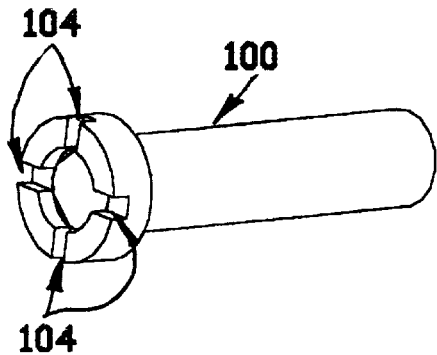
FIG. 29 is a perspective view of a slotted head rivet configuration.
Figure 20:
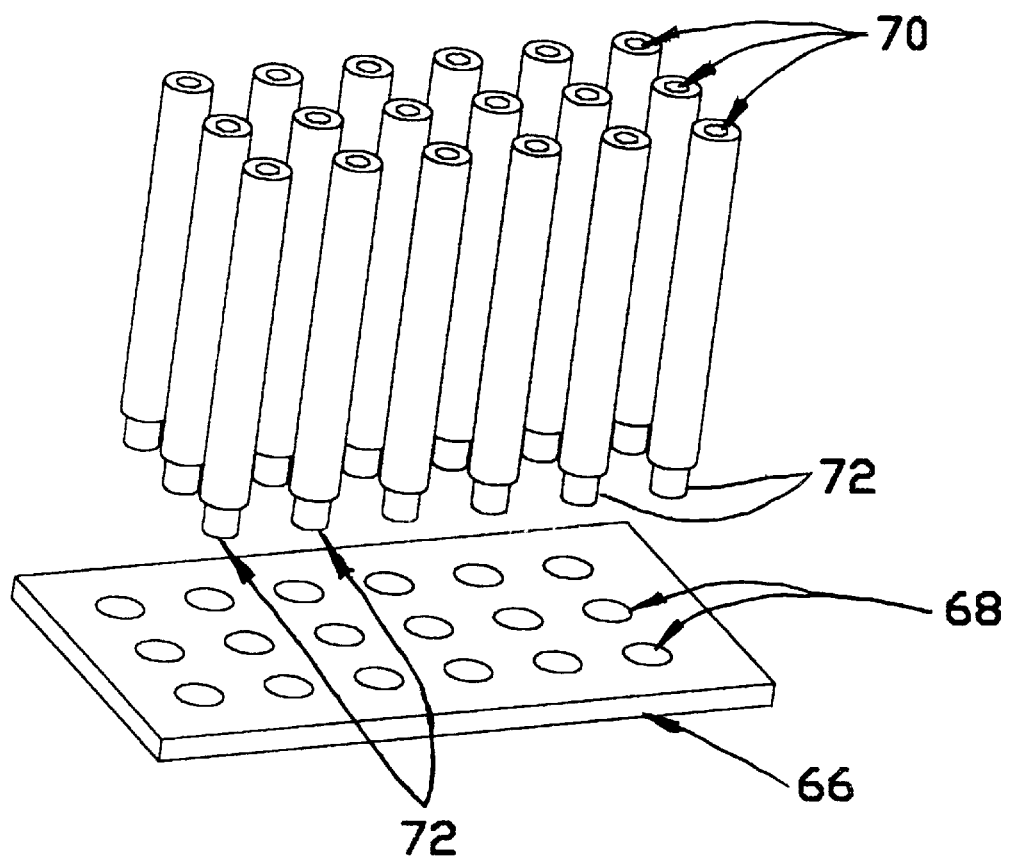
FIG. 20 is an exploded perspective view of a second embodiment of the assembled version of the heat sink.

FIGS. 29 and 30 shows a slotted head 98 on a rivet 100, the head 98 of sufficient depth to contact the structure 102 to be cooled, increasing conductive heat transfer. The slots 104 allow air flow into the hollow tube portion of the rivet 100.

Figure 31:
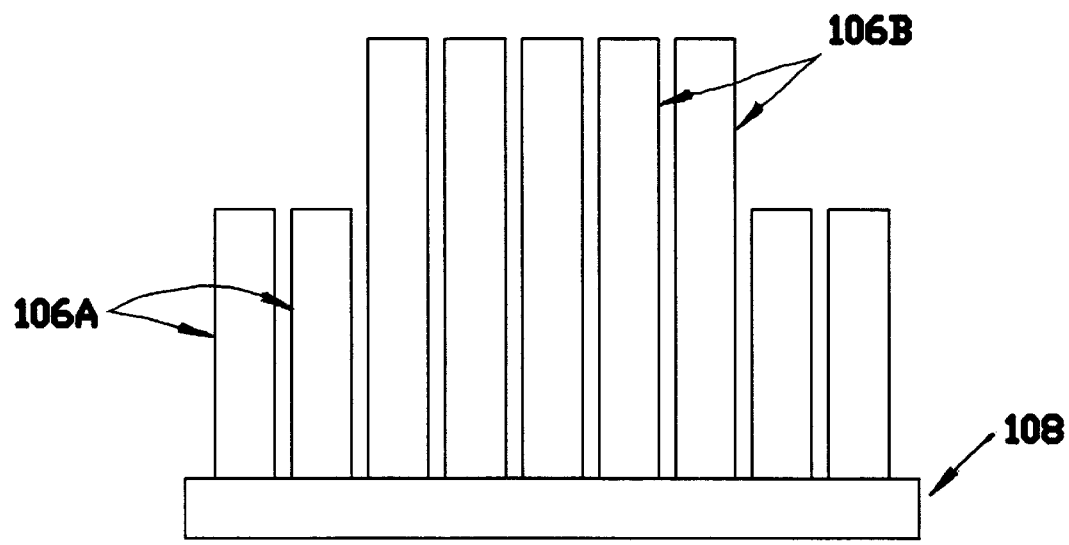
FIG. 31 is an elevational view of a heat sink with a varying height tube array in a heat sink.
Figure 32:
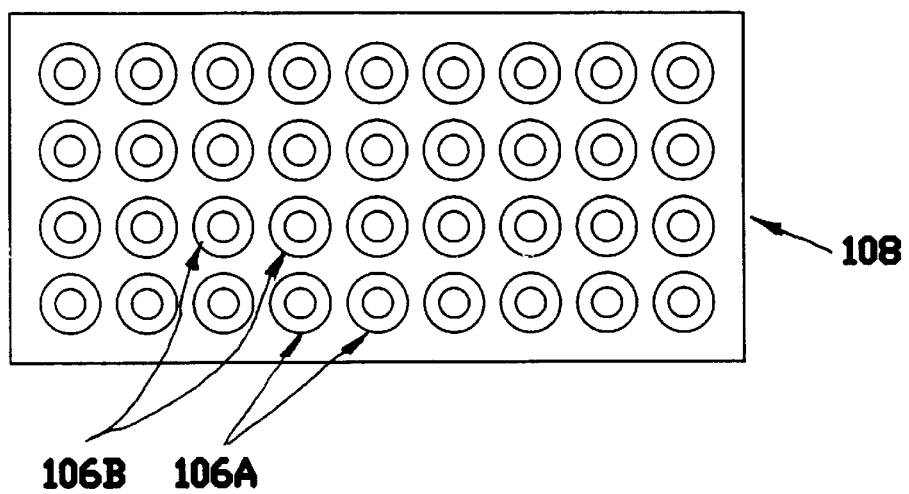
FIG. 32 is a plan view of the heat sink shown in FIG. 31.
Figure 33:
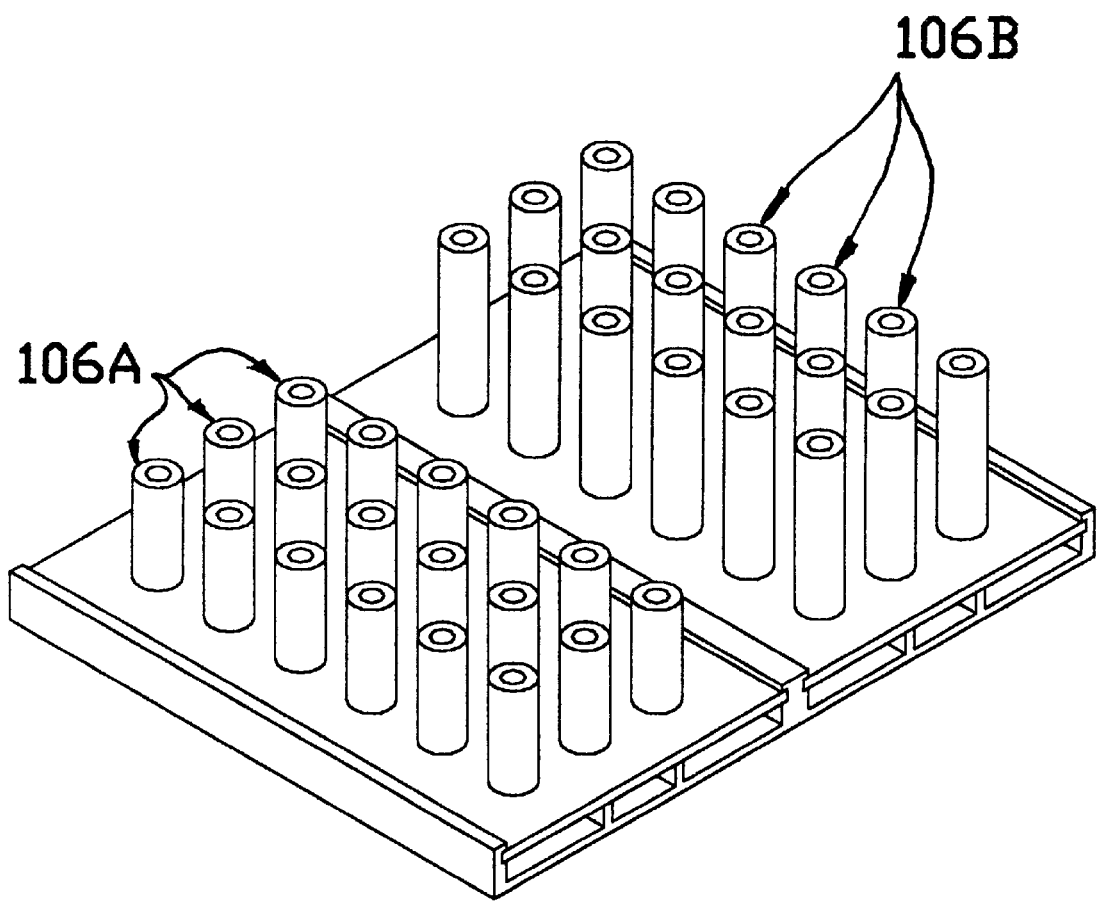
FIG. 33 is a fragmentary perspective view of the heat sink shown in FIGS. 31 and 32.

FIGS. 31–33 demonstrate the ability of the process of the present invention to provide tubes 106A, 106B of varying height so as to increase heat transfer from the center of the heat sink 108, which is sometimes a desirable feature.

What is claimed is:

1. A process for forming a heat sink, comprising the steps of:

exerting pressure on one side of a block of heat conductive metal with a tooling plate having an array of holes while confining said block so as to cause material to be extruded from said block and into said tooling plate holes, to form an array of plugs projecting from said one side of said block of metal, said block thereby reshaped into a base plate having an array of plugs projecting from one side;

forcing said base plate and plugs into an array of tooling pins aligned with said array of plugs so as to reverse extrude material from said plugs along and around said pins into a clearance space defined by confining cylindrical bores disposed about said plugs and tooling pins so as to form an array of tubes projecting from said base plate of a longer length than said plugs.

2. The process according to claim 1 further including the step of punching out the bottom of said tubes by forcing punch tools through said base plate and into said tubes to form through air passages.

3. The process according to claim 2 further including the steps of forming a cross pattern of bottom grooves on a side of said base plate opposite said side from which said tubes project, said grooves intersecting the open bottom of said tubes in said array to allow air flow into said tubes with said base plate opposite side, to be installed against structure to be cooled.

4. The process according to claim 3 wherein said step of forming said bottom grooves carried out simultaneously with said formation of said array of plugs projecting from said base plate.

5. A process for forming a heat sink comprised of an array of tubes projecting from one side of a base plate, said method enabling a chimney effect air flow to take place through said tubes, said method including forming a pattern of through holes in said base plate, each opening into a respective of said tubes in said array; and, forming a crossing groove pattern on an opposite side of base plates intersecting said through holes in said base plate, whereby air flow along said grooves and into said holes may be induced by heating of said base plate by a structure to be cooled.

6. The process according to claim 5 wherein said tubes are reverse extruded from a base plate by forcing a block of metal against a tooling plate having an array of holes formed therein to extrude metal from said block into said holes to form plugs projecting from said base plate formed by metal remaining from said block.

7. The process according to claim 5 wherein said tubes are assembled to said base plate.

8. The process according to claim 7 wherein said tubes are formed by crimping tubular rivets to said base plate.

9. The process according to claim 7 wherein said tubes are mechanically attached to said base plate.

10. The process according to claim 5 wherein said groove pattern is formed into said base plate opposite side as said tubes are reverse extruded from said base plate.

* * * * *

UNITED STATES PATENT AND TRADEMARK OFFICE
CERTIFICATE OF CORRECTION

PATENT NO. : 6,134,783
DATED : October 24, 2000
INVENTOR(S) : Ronald D. Bargman et al.

It is certified that error appears in the above-identified patent and that said Letters Patent is hereby corrected as shown below:

Column 5,
Line 13, starting at "FIG. 28 shows" should be a new paragraph.

Column 6,
Line 10, delete "to be".
Line 14, after "bottom grooves" insert -- is --.
Line 22, after "respective" insert -- one -- .
Line 42, delete "base plate" insert therefor -- block --.

Signed and Sealed this

Twenty-fifth Day of June, 2002

Attest:

JAMES E. ROGAN
Attesting Officer  Director of the United States Patent and Trademark Office